United States Patent
Savaria

(10) Patent No.: US 6,564,979 B2
(45) Date of Patent: May 20, 2003

(54) METHOD AND APPARATUS FOR DISPENSING ADHESIVE ON MICROELECTRONIC SUBSTRATE SUPPORTS

(75) Inventor: Albert M. Savaria, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/908,669

(22) Filed: Jul. 18, 2001

(65) Prior Publication Data

US 2003/0015553 A1 Jan. 23, 2003

(51) Int. Cl.[7] .................................................. B05B 1/00
(52) U.S. Cl. .......................... 222/566; 222/1; 222/192; 222/533; 427/96
(58) Field of Search ................................ 222/160, 167, 222/168, 526, 533, 536, 537, 566, 1, 192; 427/96

(56) References Cited

U.S. PATENT DOCUMENTS

| | | |
|---|---|---|
| 5,062,565 A | 11/1991 | Wood et al. |
| 5,145,099 A | 9/1992 | Wood et al. |
| 5,146,308 A | 9/1992 | Chance et al. |
| 5,423,889 A * | 6/1995 | Colquitt et al. ............. 156/295 |
| 5,593,927 A | 1/1997 | Farnworth et al. |
| 5,677,566 A | 10/1997 | King et al. |
| 5,696,033 A | 12/1997 | Kinsman |
| 5,739,585 A | 4/1998 | Akram et al. |
| D394,944 S | 6/1998 | Farnworth et al. |
| 5,795,390 A * | 8/1998 | Cavallaro ................... 118/314 |
| D402,638 S | 12/1998 | Farnworth et al. |
| 5,851,845 A | 12/1998 | Wood et al. |
| 5,879,965 A | 3/1999 | Jiang et al. |
| 5,882,133 A * | 3/1999 | Chao et al. ................. 401/193 |
| 5,891,753 A | 4/1999 | Akram |
| 5,891,797 A | 4/1999 | Farrar |
| 5,893,726 A | 4/1999 | Farnworth et al. |
| 5,894,218 A | 4/1999 | Farnworth et al. |
| 5,898,224 A | 4/1999 | Akram |
| 5,933,713 A | 8/1999 | Farnworth |
| 5,938,956 A | 8/1999 | Hembree et al. |
| 5,946,553 A | 8/1999 | Wood et al. |
| 5,956,236 A | 9/1999 | Corisis et al. |
| 5,958,100 A | 9/1999 | Farnworth et al. |
| 5,976,955 A | 11/1999 | Hodges |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 6,008,070 A | 12/1999 | Farnworth |
| 6,018,249 A | 1/2000 | Akram et al. |
| 6,020,624 A | 2/2000 | Wood et al. |
| 6,020,629 A | 2/2000 | Farnworth et al. |
| 6,025,728 A | 2/2000 | Hembree et al. |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |

(List continued on next page.)

Primary Examiner—J. Casimer Jacyna
(74) Attorney, Agent, or Firm—Perkins Coie LLP

(57) ABSTRACT

A method and apparatus for dispensing adhesive on a support substrate for carrying microelectronic substrates. In one embodiment, the apparatus can include at least one dispense nozzle having at least one aperture configured to dispense the adhesive along a dispense axis toward the support substrate. The dispense nozzle can be coupleable to a source of the adhesive, and the apparatus can further include a standoff member operatively coupled to the at least one dispense nozzle. The standoff member can include a contact surface that projects beyond the aperture and is configured to contact the support substrate while the aperture of the dispense nozzle is spaced apart from the support substrate. Accordingly, the nozzle can consistently be spaced apart from the support substrate while the adhesive is dispensed onto the support substrate.

59 Claims, 3 Drawing Sheets

U.S. PATENT DOCUMENTS

| | | |
|---|---|---|
| 6,049,125 A | 4/2000 | Brooks et al. |
| 6,064,194 A | 5/2000 | Farnworth et al. |
| 6,066,514 A | 5/2000 | King et al. |
| 6,072,233 A | 6/2000 | Corisis et al. |
| 6,072,236 A | 6/2000 | Akram et al. |
| 6,075,288 A | 6/2000 | Akram |
| 6,089,920 A | 7/2000 | Farnworth et al. |
| 6,097,087 A | 8/2000 | Farnworth et al. |
| 6,103,547 A | 8/2000 | Corisis et al. |
| 6,107,122 A | 8/2000 | Wood et al. |
| 6,107,680 A | 8/2000 | Hodges |
| 6,117,382 A | 9/2000 | Thummel |
| 6,124,634 A | 9/2000 | Akram et al. |
| 6,130,474 A | 10/2000 | Corisis |
| 6,133,068 A | 10/2000 | Kinsman |
| 6,148,509 A | 11/2000 | Schoenfeld et al. |
| 6,150,710 A | 11/2000 | Corisis |
| 6,150,717 A | 11/2000 | Wood et al. |
| 6,153,924 A | 11/2000 | Kinsman |
| 6,159,764 A | 12/2000 | Kinsman et al. |
| 6,172,419 B1 | 1/2001 | Kinsman |
| 6,184,465 B1 | 2/2001 | Corisis |
| 6,188,232 B1 | 2/2001 | Akram et al. |
| 6,198,172 B1 | 3/2001 | King et al. |
| 6,201,304 B1 | 3/2001 | Moden |
| 6,208,519 B1 | 3/2001 | Jiang et al. |
| 6,210,992 B1 | 4/2001 | Tandy et al. |
| 6,214,716 B1 | 4/2001 | Akram |
| 6,215,175 B1 | 4/2001 | Kinsman |
| 6,225,689 B1 | 5/2001 | Moden et al. |
| 6,228,548 B1 | 5/2001 | King et al. |
| 6,229,202 B1 | 5/2001 | Corisis |
| 6,232,666 B1 | 5/2001 | Corisis et al. |
| 6,239,489 B1 | 5/2001 | Jiang |
| 6,246,108 B1 | 6/2001 | Corisis et al. |
| 6,246,110 B1 | 6/2001 | Kinsman et al. |
| 6,247,629 B1 | 6/2001 | Jacobson et al. |
| 6,252,772 B1 | 6/2001 | Allen |
| 6,258,623 B1 | 7/2001 | Moden et al. |
| 6,258,624 B1 | 7/2001 | Corisis |
| 6,259,153 B1 | 7/2001 | Corisis |
| 6,265,766 B1 | 7/2001 | Moden |
| 6,277,671 B1 | 8/2001 | Tripard |
| 6,281,042 B1 | 8/2001 | Ahn et al. |
| 6,284,571 B1 | 9/2001 | Corisis et al. |
| 6,285,204 B1 | 9/2001 | Farnworth |
| 6,291,894 B1 | 9/2001 | Farnworth et al. |
| 6,294,839 B1 | 9/2001 | Mess et al. |
| 6,297,547 B1 | 10/2001 | Akram |
| 6,303,981 B1 | 10/2001 | Moden |
| 6,303,985 B1 | 10/2001 | Larson et al. |
| 6,310,390 B1 | 10/2001 | Moden |
| 6,314,639 B1 | 11/2001 | Corisis |
| 6,316,285 B1 | 11/2001 | Jiang et al. |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,329,222 B1 | 12/2001 | Corisis et al. |
| 6,329,705 B1 | 12/2001 | Ahmad |
| 6,331,221 B1 | 12/2001 | Cobbley |
| 6,331,448 B1 | 12/2001 | Ahmad |
| 6,331,453 B1 | 12/2001 | Bolken et al. |
| 6,332,766 B1 | 12/2001 | Thummel |
| 6,339,253 B1 | 1/2002 | Corisis |
| 6,344,976 B1 | 2/2002 | Schoenfeld et al. |
| 6,405,902 B2 * | 6/2002 | Everett .................. 222/214 |
| 6,435,492 B1 * | 8/2002 | Behler et al. .............. 269/21 |

* cited by examiner

METHOD AND APPARATUS FOR DISPENSING ADHESIVE ON MICROELECTRONIC SUBSTRATE SUPPORTS

BACKGROUND

The present invention is directed generally to methods and apparatuses for dispensing adhesives on support media for microelectronic substrates. Packaged microelectronic substrate assemblies, such as memory chips and microprocessor chips, typically include a microelectronic substrate die mounted on a thin support substrate and encased in a plastic protective covering. The die includes functional devices or features, such as memory cells, processor circuits and interconnecting wiring. The die also typically includes bond pads or other terminal devices electrically coupled to the functional devices within the die. These terminals are connected to corresponding terminals of the support substrate with wire bonds, which are in turn electrically coupled to terminals accessible from outside the package to connect the die to buses, circuits and/or other microelectronic substrate assemblies.

In one conventional arrangement, a plurality of microelectronic substrates are attached to a single support substrate by dispensing dots of adhesive paste on the support substrate and pressing the microelectronic substrates against the dots. The adhesive paste is typically dispensed through one or more automatically actuated nozzles. Because the support substrate is generally thin and flexible, one conventional approach is to mount the support substrate on a flat vacuum table to keep the substrate level while the nozzles dispense the adhesive. The nozzles are then lowered into contact with the support substrate, then raised slightly to create a "dispense gap." The adhesive is directed through the nozzles, across the dispense gap and onto the support substrate to form the adhesive dots. This process is repeated until the support substrate has the correct number of adhesive dots.

The amount of adhesive dispensed on the support substrate must be precisely controlled to ensure that the microelectronic substrates are adequately secured to the support substrate without using an excessive amount of adhesive. It is also desirable to prevent the adhesive from remaining in contact with the nozzle after being dispensed (which can cause the adhesive to attach to the nozzle instead of the support substrate). It is further desirable to prevent the adhesive from contacting exposed electrical terminals on either the support substrate or the microelectronic substrate.

One drawback with the dispense process described above is that it may not adequately control the amount of adhesive placed on the support substrate. For example, the vacuum table may not keep the support substrate flat enough, despite the vacuum force applied to the support substrate. As a result, a warped support substrate can be springy enough to remain biased against the nozzles as the nozzles move upwardly from the surface of the support substrate to form the dispense gap. This can locally reduce or eliminate the dispense gap. Accordingly, the support substrate can block the nozzles, and/or the adhesive can cling to the nozzles. In either case, the adhesive dispensed on the support substrate may be inadequate to secure at least some of the microelectronic substrates. When the adhesive bond between the microelectronic substrates and the support substrate are inadequate, some or all of the support substrate must be discarded, increasing the cost of producing packaged microelectronic assemblies.

SUMMARY

The present invention is directed toward methods and apparatuses for dispensing a flowable adhesive on a support substrate that supports a microelectronic substrate. An apparatus in accordance with one aspect of the invention includes at least one dispense nozzle having at least one aperture configured to dispense the adhesive toward the support substrate, with the dispense nozzle being coupleable to a source of the adhesive. The apparatus can further include a standoff member operatively coupled to the at least one dispense nozzle. A contact surface of the standoff member projects beyond the aperture and is configured to contact the support substrate while the aperture of the dispense nozzle is spaced apart from the support substrate.

In one aspect of the invention, the apparatus can further include a carrier having a support surface configured to releasably carry the support substrate.

The carrier can include at least one forcing member operatively coupled to the support surface to force the support surface toward a selected position. The support surface can have a plurality of vacuum apertures configured to be coupled to a vacuum source to draw the support substrate toward the support surface. In still a further aspect of the invention, the nozzle can be one of a plurality of nozzles and the standoff member can be one of two standoff members. The standoff members can be spaced apart from each other by a distance sufficient to allow visual access to the nozzles.

The invention is also directed toward a method for dispensing a flowable adhesive on a support substrate for supporting microelectronic substrates. The method can include positioning a nozzle proximate to a support substrate, moving at least one of the nozzle and the support substrate relative to the other, and contacting a standoff member with the support substrate while the standoff member is operatively coupled to the nozzle and while an aperture of the nozzle is spaced apart from the support substrate to at least restrict further relative motion between the nozzle and the support substrate. The method can further include directing a flowable adhesive through the aperture of the nozzle and toward the support substrate while the standoff member contacts the support substrate.

In a further aspect of the invention, the method can include offsetting an aperture of the nozzle from the support substrate by a distance of from about 0.004 inch to about 0.005 inch while the standoff member contacts the support substrate. The method can further include directing the flowable adhesive through a plurality of nozzles, with at least one of the nozzles having a flow area different than that of another of the nozzles.

DETAILED DESCRIPTION

The following disclosure describes methods and apparatuses for attaching microelectronic substrates to support substrates to form packaged microelectronic devices. The term "microelectronic substrate" is used throughout to include a substrate or die upon which and/or in which microelectronic circuits or components, data storage elements or layers, and/or conductive lines or vias are or can be fabricated. Many specific details of certain embodiments of the invention are set forth in the following description and in FIGS. 1–4D to provide a thorough understanding of these embodiments. One skilled in the art, however, will understand that the present invention may have additional embodiments, and that the invention may be practiced without several of the details described below.

Figure 1:
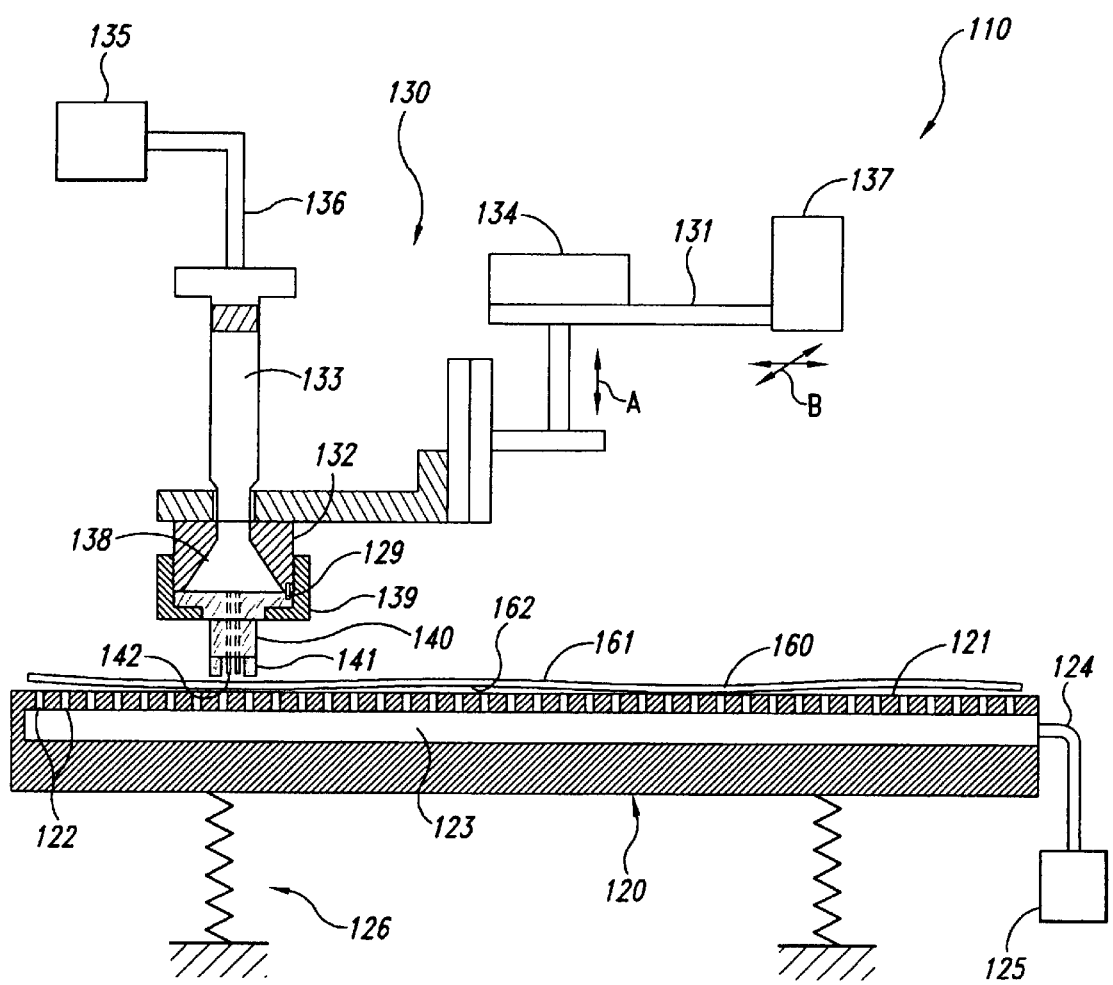
FIG. 1 is a side view of an apparatus in accordance with an embodiment of the invention showing selected components schematically.

FIG. 1 illustrates an apparatus 110 for dispensing a flowable adhesive, such as an adhesive paste, on a support substrate 160 in accordance with an embodiment of the invention. The apparatus 110 can include a carrier 120 that holds the support substrate 160 in position while an adhesive dispenser 130 applies discrete volumes of adhesive to the support substrate 160. The adhesive dispenser 130 can include one or more nozzles 142 for dispensing the adhesive, and one or more standoffs 141 that maintain a pre-selected gap between the nozzles 142 and an upper surface 161 of the support substrate 160, as described in greater detail below.

In one aspect of this embodiment, the carrier 120 can be supported with a forcing device 126 that forces the carrier 120 to a selected neutral position, but allows the carrier 120 to be displaced slightly in a vertical direction. The forcing device 126 can include a spring, spring and damper, or other device that causes the carrier to return to the neutral position. The carrier 120 can have an upwardly facing support surface 121 that receives a downwardly facing lower surface 162 of the support substrate 160. The support surface 121 can be perforated with a plurality of vacuum apertures 122 that are in fluid communication with a plenum 123. The plenum 123 can be coupled to a vacuum source 125 with a vacuum conduit 124. Accordingly, when the vacuum source 125 applies a vacuum to the plenum 123 and the vacuum apertures 122, the carrier 120 can draw the support substrate 160 downwardly against the support surface 121.

As described below, the adhesive dispenser 130 can apply the appropriate amount of adhesive to the support substrate 160 even if the support substrate 160 remains warped (as illustrated in FIG. 1) despite the vacuum force supplied by the vacuum source 125. Accordingly, in one alternate embodiment, the vacuum source 125, the vacuum conduit 124, the vacuum apertures 122, and the plenum 123 can be eliminated without preventing the adhesive dispenser 130 from operating successfully. In either embodiment, the adhesive dispenser 130 can effectively apply the adhesive to a thin flexible epoxy resin support substrate, such as a BT (bismaleimide triazine) substrate or other suitable support substrate.

The adhesive dispenser 130 can include a frame 131 that supports the dispense nozzles 142 and the standoffs 141 for movement toward and away from the support substrate 160, as indicated by arrow "A." The frame 131 itself can be moved transversely, as indicated by arrow "B," to position the dispense nozzles 142 over a target region of the support substrate 160. Accordingly, the frame 131 can be coupled to a positioning device 137, which can include one or more manual micrometers or automated actuators.

In one aspect of this embodiment, the dispense nozzles 142 and the standoffs 141 can be mounted to a support member 140 which is carried by a head 132. The head 132 can include a distribution chamber 138 for distributing the adhesive to the dispense nozzles 142, and the support member 140 can be mounted to the head 132 with a threaded collar 139. A locating pin 129 can register the support member 140 relative to the head 132.

The adhesive dispenser 130 can further include a container or reservoir 133 (such as a syringe) attached to the head 132 and configured to hold a quantity of the flowable adhesive. The flowable adhesive can be a nonconductive epoxy, such as a QMI536 adhesive, available from Dexter Electronic Materials of San Diego, Calif. The container 133 can be coupled to a pressure source 135 (such as a pneumatic pump) with a pressure line 136 to pressurize the adhesive and force the adhesive through the dispense nozzles 142. An actuator 134 can be operatively coupled between the frame 131 and the support member 140 to move the dispense nozzles 142 and the standoffs 141 toward and away from the support substrate 160, as indicated by arrow A. The actuator 134 can be an electric, pneumatic, hydraulic or other device configured to drive the support member 140. Alternatively, the actuator can be coupled to the carrier 120 to move the carrier 120 in addition to or in lieu of moving the support member 140.

Figure 2:
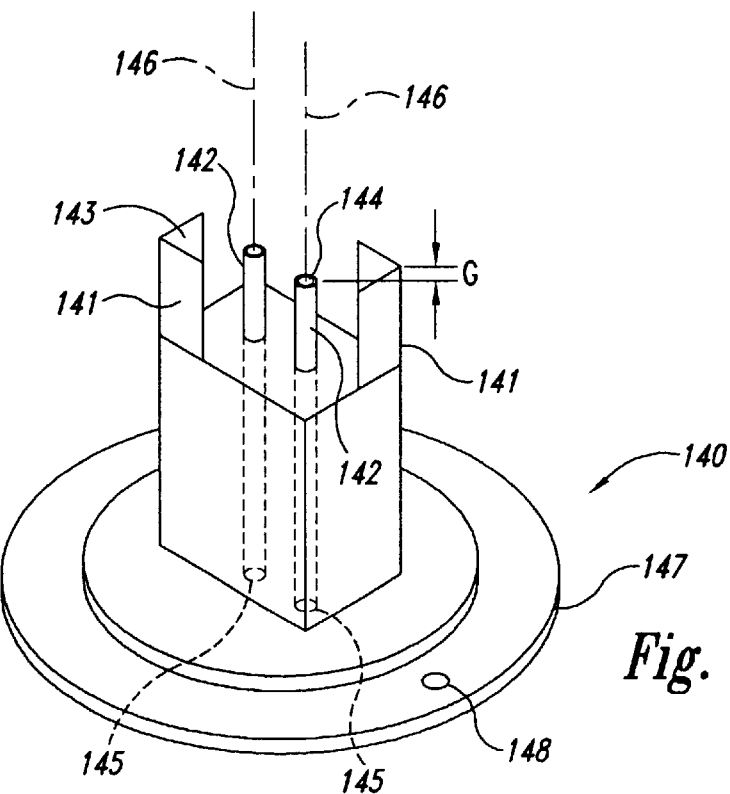
FIG. 2 is an isometric view of a portion of the apparatus shown in FIG. 1.

FIG. 2 is an isometric view of an inverted support member 140 generally similar to that shown in FIG. 1. The support member 140 can include two dispense nozzles 142 and two standoffs 141. In alternate embodiments, the support member 140 can include more or fewer nozzles 142 and/or standoffs 141, as described below with reference to FIGS. 4A–D. In any of these embodiments, each dispense nozzle 142 can have an exit aperture 144 for dispensing the adhesive along a dispense axis 146 toward the support substrate 160 (FIG. 1).

In one embodiment, the exit aperture 144 can have a diameter of about 0.028 inch, and in other embodiments, the exit aperture 144 can have other values, depending, for example, on the amount of adhesive to be dispensed through the exit aperture 144. Each dispense nozzle 142 can further have a coupling aperture 145 configured to be aligned with the distribution chamber 138 (FIG. 1) for receiving the flowable adhesive.

Each standoff 141 can have a contact surface 143 configured to contact the support substrate 160. The contact surface 143 of each standoff 141 can project beyond the exit apertures 144 by a gap "G" in a direction generally aligned with the flow axes 146. Accordingly, the exit apertures 144 can be consistently spaced apart from the support substrate 160 by the gap G while the adhesive is dispensed. In one embodiment, the gap G can have a value of from about 0.004 inch to about 0.005 inch. In other embodiments, the gap G can have other values. Generally, the gap G can be increased from the above range for larger volumes of dispensed adhesive and decreased for smaller volumes.

In one aspect of an embodiment shown in FIG. 2, the standoffs 141 can be spaced apart from the dispense nozzles 142 by a distance that is sufficient to prevent contact between the standoffs 141 and the dispensed adhesive. In another aspect of this embodiment, the standoffs 141 can be spaced apart from each other by a distance that is sufficient to allow visual access to the dispense nozzles 142 during operation. Accordingly, the operator can observe the action of the dispense nozzles 142 in situ. In an embodiment shown in FIG. 2, the support member 140 can include two standoffs 141 spaced apart to allow visual access to the nozzles 142, and in other embodiments, the support member 140 can include a unitary standoff or more than two standoffs configured to allow visual access. In still further embodiments, the standoff(s) can be positioned without regard to visual access.

In a further aspect of an embodiment shown in FIG. 2, the support member 140 can include a flange 147 that is mounted in the head 132 (FIG. 1) of the adhesive dispenser 130 (FIG. 1). The flange 147 can include an aperture 148 for receiving the locating pin 129 (FIG. 1) of the head 132. The support member 140 can be releasably attached to the head 132 with the collar 139, as described above with reference to FIG. 1. In other embodiments, the support member 140 can have other coupling arrangements with the head 132, or the nozzles 142 and standoffs 141 can be connected directly to the head 132.

Operation of an embodiment of the apparatus 110 is described below with reference to FIGS. 1 and 2. In one aspect of this embodiment, the support substrate 160 can be placed on the support surface 121 of the carrier 120, with the upper surface 161 of the support substrate 160 facing upwardly, and the lower surface 162 facing downwardly. When the carrier 120 includes vacuum apertures 122 and a vacuum source 125, the vacuum source 125 can be activated to at least partially draw the support substrate 160 down toward the support surface 121. When the carrier 120 does not include the vacuum apertures 122 and the vacuum source 125, the support substrate 160 can be secured to the support surface 121 with other devices, such as clamps or edge locators, or the support substrate 160 can be unsecured relative to the carrier 120, for example, when contact between the standoffs 141 and the support substrate 160 does not cause the support substrate 160 to shift significantly.

Once the support substrate 160 is in position, the actuator 134 of the adhesive dispenser 130 can be activated to move the support member 140 downwardly toward the support substrate 160 until at least one of the standoffs 141 contacts the upper surface 161 of the support substrate 160. The support member 140 can then move downwardly an additional amount (which may cause the carrier 120 to displace downwardly against the return force provided by the forcing member 126) to engage all the standoffs 141 with the upper surface 161. As the standoffs 141 contact the support substrate 160, the support substrate 160 can locally flatten (if it is locally bowed upwardly) so that the dispense nozzles 142 are offset from the upper surface 161 of the support substrate 160 by the fixed gap G. The flowable adhesive is then dispensed onto the support substrate 160 through the nozzles 142.

Figure 3:
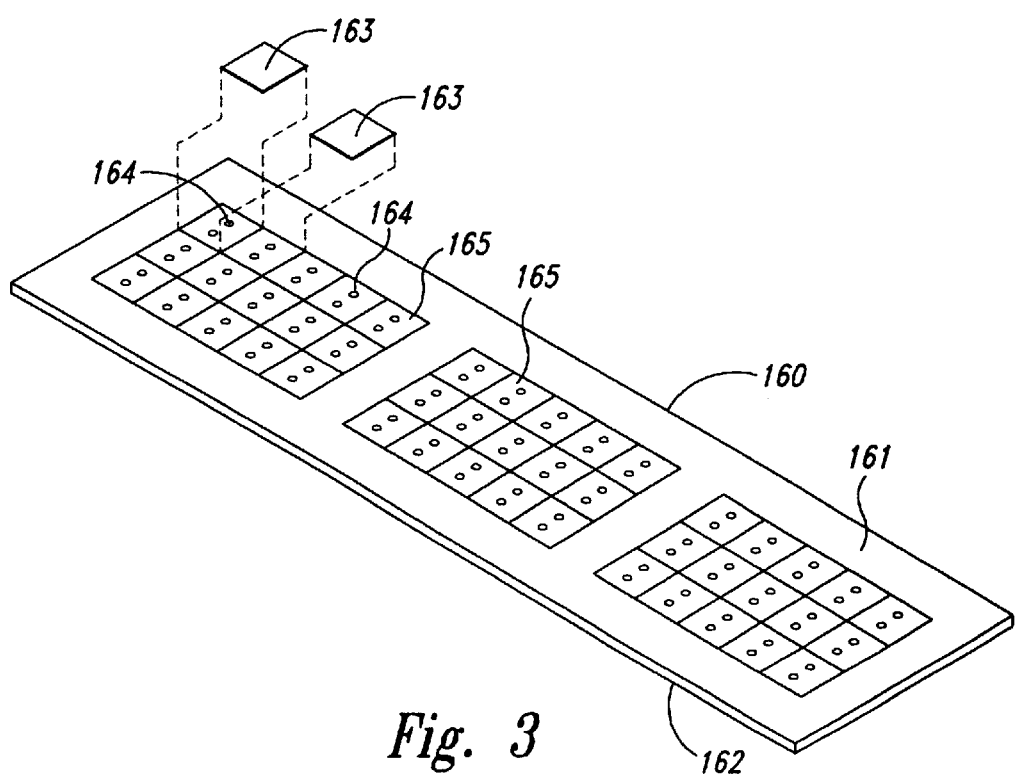
FIG. 3 is an isometric view of a substrate support and microelectronic substrates suitable for use with an embodiment of the apparatus shown in FIG. 1.

Referring now to FIG. 3, the support substrate 160 can have discrete adhesive volumes or dots 164 located at a plurality of attachment sites 165, after the nozzles 142 have completed the dispense process. A microelectronic substrate 163 can be automatically aligned with each attachment site 165 using a robotic pick-and-place device (not shown in FIG. 3), which also secures the microelectronic substrates 163 to the support substrate 160 by engaging the microelectronic substrates 163 with the adhesive dots 164. The support substrate 160 with the microelectronic substrates 163 attached is then removed from the carrier 120 and the forcing device 126 returns the carrier 120 to a neutral position.

One feature of an embodiment of the apparatus 110 described above with reference to FIGS. 1–3 is that it can include standoffs 141 having contact surfaces 143 located a fixed distance from the nozzle exit apertures 144 along the dispense axis 146. Accordingly, the exit apertures 144 can consistently be spaced apart from the surface of the support substrate 160 by the gap G, even if the support substrate 160 is warped. An advantage of this feature is that the adhesive dots 164 dispensed through the nozzles 142 can have a consistent volume, and can easily separate from the nozzles 142 during the dispense operation. As a result, the microelectronic substrates 163 are more likely to remain attached to the support substrate 160 because they engage the correct amount of adhesive.

Another advantage of the foregoing features is that the nozzles 142 can be less likely to be obstructed with residual adhesive (after dispensing the adhesive) because the nozzles 142 are spaced apart from the surface of the support substrate 160. Accordingly, the nozzles 142 can more consistently dispense the correct amount of adhesive on the support substrate 160.

A further advantage of the foregoing features is that the apparatus 110 can reduce the number of support substrates 160 that are discarded during operation due to incorrectly dispensed adhesive. Another advantage of these features is that support substrates 160 that are typically considered too warped or too non-uniform to carry the substrates 163 can now be used. Still a further advantage of these features is that the apparatus 110 can be simplified when compared to conventional adhesive paste apparatuses. For example, the vacuum system of the carrier can be eliminated and/or replaced with a simpler system without impacting the accuracy with which the device dispenses the adhesive onto the support substrate 160.

Figure 4A:
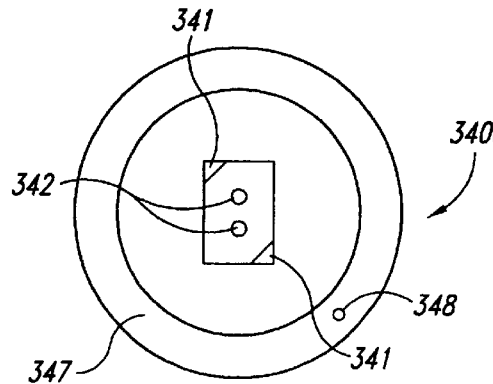
FIGS. 4A–D are bottom views of support members for use with an embodiment of the apparatus shown in FIG. 1 in accordance with further embodiments of the invention.
Figure 4B:
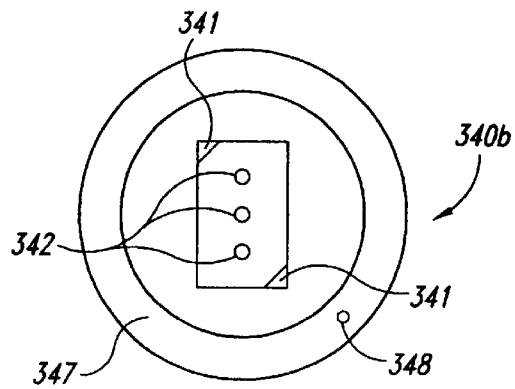
Figure 4C:
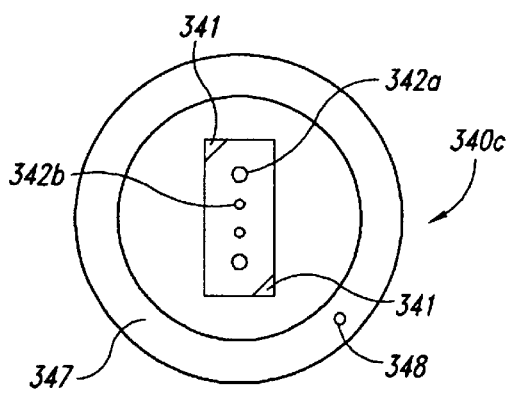
Figure 4D:
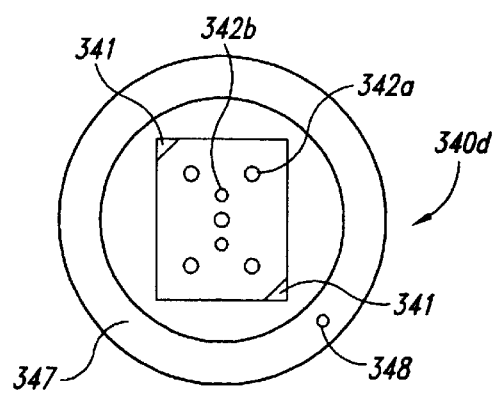

FIGS. 4A–D illustrate bottom views of support members configured for use with an embodiment of the apparatus 110 described above with reference to FIGS. 1–3. FIG. 4A illustrates a support member 340a generally similar to the support member 140 shown in FIGS. 1 and 2. Accordingly, the support member 340a includes a flange 347, an aperture 348, and two standoffs 341 spaced outwardly from two dispense nozzles 342. FIG. 4B illustrates a support member 340b that is slightly larger than the support member 340a shown in FIG. 4A, and includes three dispense nozzles 342. Accordingly, the support member 340b can dispense adhesive configured to support slightly larger microelectronic substrates than those shown in FIG. 3. FIG. 4C illustrates a support member 340c having larger diameter nozzles 342a and smaller diameter nozzles 342b. The larger diameter nozzles 340a can dispense a larger volume of adhesive than the smaller diameter nozzles 342b while operating simultaneously with the smaller diameter nozzles 342b. Accordingly, the larger nozzles 342a can be used when the configuration of the microelectronic substrate requires a greater amount of adhesive. FIG. 4D illustrates a support member 340d having larger dispense nozzles 342a and smaller dispense nozzles 342b arranged in a pattern different than that shown in FIG. 4C, for supporting still larger microelectronic substrates.

One feature of the embodiments of the support members 340a–d described above with reference to FIGS. 4A–D is that each support member can include a flange 347 having a size at least approximately the same as that of the flange 147 (FIG. 1). Accordingly, each support member 340a–d can be interchangeably positioned on the same head 132 (FIG. 1). An advantage of this feature is that the same head 132 and adhesive dispenser 130 (FIG. 1) can be used to provide adhesive for a wide variety of support substrates and microelectronic substrates. Accordingly, the cost of producing packaged microelectronic substrates can be reduced because a single adhesive dispenser 130 (which may be relatively expensive) can operate on many types of microelectronic substrates and support substrates by using interchangeable support members (which can be manufactured from relatively low cost materials).

From the foregoing, it will be appreciated that, although specific embodiments of the invention have been described herein for purposes of illustration, various modifications may be made without deviating from the spirit and scope of the invention. For example, in some embodiments, a single dispense nozzle can have a plurality of exit apertures for dispensing a corresponding plurality of adhesive dots. Accordingly, the invention is not limited except as by the appended claims.

I/we claim:

1. An apparatus for dispensing a flowable adhesive on a support substrate for supporting a microelectronic substrate, comprising:
   at least one dispense nozzle having at least one aperture configured to dispense the adhesive toward the support substrate, the dispense nozzle being coupleable to a source of the adhesive;
   a standoff member operatively coupled to the at least one dispense nozzle;
   a contact surface of the standoff member, the contact surface projecting beyond the aperture and configured to contact the support substrate while the aperture of the dispense nozzle is spaced apart from the support substrate; and
   a carrier having a support surface configured to releasably carry the support substrate, wherein the carrier includes at least one forcing device operatively coupled to the support surface to force the support surface toward a selected position.

2. The apparatus of claim 1 wherein the support surface has a plurality of vacuum apertures configured to be coupled to a vacuum source to draw the support substrate toward the support surface.

3. The apparatus of claim 1 wherein the dispense nozzle is a first dispense nozzle and the aperture is a first aperture having a first flow area, and wherein the apparatus further comprises a second dispense nozzle having a second aperture with a second flow area greater than the first flow area.

4. The apparatus of claim 1, further comprising a support member carrying the at least one nozzle.

5. The apparatus of claim 1 wherein the standoff member is a first standoff member and wherein the apparatus further comprises a second standoff member operatively coupled to the at least one dispense nozzle, the second standoff member being spaced apart from the first standoff member to allow visual access to the at least one dispense nozzle.

6. The apparatus of claim 1 wherein the contact surface projects beyond the aperture by a distance of from about 0.004 inch to about 0.005 inch.

7. The apparatus of claim 1 wherein the dispense nozzle is one of a plurality of dispense nozzles.

8. The apparatus of claim 1 wherein the aperture has a diameter of about 0.028 inch.

9. The apparatus of claim 1, further comprising a vessel configured to contain the flowable adhesive, the vessel being coupled in fluid communication with the at least one dispense nozzle.

10. The apparatus of claim 1, further comprising a pneumatic actuator operatively coupled to the nozzle to propel the adhesive through the nozzle.

11. The apparatus of claim 1 wherein the aperture of the dispense nozzle is configured to dispense the adhesive along a dispense axis toward the support substrate, and wherein the apparatus further comprises a linear actuator operatively coupled to the nozzle to move the nozzle along a path generally aligned with the dispense axis.

12. The apparatus of claim 1 wherein the aperture of the dispense nozzle is configured to dispense the adhesive along a dispense axis toward the support substrate, and wherein the contact surface is spaced apart from the aperture in a direction generally aligned with the dispense axis.

13. An apparatus for dispensing a flowable adhesive onto a support substrate for supporting microelectronic substrates, comprising:
   a vessel configured to contain the flowable adhesive;
   a support member;
   a plurality of dispense nozzles carried by the support member, each dispense nozzle having at least one aperture configured to dispense the adhesive along a dispense axis toward the support substrate, each dispense nozzle being in fluid communication with the vessel;
   a first standoff member carried by the support member and having a first contact surface projecting beyond the apertures of the dispense nozzles, the first contact surface being configured to contact the support substrate while the apertures of the dispense nozzles are spaced apart from the support substrate;
   a second standoff member carried by the support member and having a second contact surface projecting beyond the apertures of the dispense nozzles, the second contact surface being configured to contact the support substrate while the apertures of the dispense nozzles are spaced apart from the support substrate, the second standoff member being spaced apart from the first standoff member to allow visual access to the nozzles; and
   a carrier having a support surface configured to releasably carry the support substrate, wherein the carrier includes a forcing device operatively coupled to the support surface to force the support surface toward a selected position.

14. The apparatus of claim 13 wherein the first and second contact surfaces project beyond the apertures of the dispense nozzles by a distance of from about 0.004 inch to about 0.005 inch.

15. The apparatus of claim 13 wherein the first aperture has a first flow area and the second aperture has a second flow area greater than the first flow area.

16. The apparatus of claim 13 wherein the support surface has a plurality of vacuum apertures configured to be coupled to a vacuum source to draw the support substrate toward the support surface.

17. An apparatus for dispensing a flowable adhesive on a support substrate for supporting microelectronic substrates, comprising:
   a source of the flowable adhesive;
   a support member;
   at least one dispense nozzle carried by the support member and having at least one aperture configured to dispense the adhesive toward the support substrate;
   a standoff member carried by the support member and having a contact surface projecting beyond the aperture of the dispense nozzle and configured to contact the support substrate while the aperture is spaced apart from the support substrate;
   a carrier having a support surface configured to releasably carry the support substrate, wherein the carrier includes a forcing device operatively coupled to the support surface to force the support surface toward a selected position; and
   an actuator operatively coupled to at least one of the dispense nozzle and the carrier to move at least one of the dispense nozzle and the carrier toward and away from the other.

18. The apparatus of claim 17 wherein the standoff member is a first standoff member and wherein the apparatus further comprises a second standoff member carried by the support member, the second standoff member being spaced apart from the first standoff member to allow visual access to the at least one dispense nozzle.

19. The apparatus of claim 17 wherein the contact surface projects beyond the aperture of the dispense nozzle by a distance of from about 0.004 inch to about 0.005 inch.

20. The apparatus of claim 17 wherein the dispense nozzle is one of a plurality of dispense nozzles.

21. The apparatus of claim 17 wherein the aperture of the dispense nozzle has a diameter of about 0.028 inch.

22. The apparatus of claim 17 wherein the support surface has a plurality of vacuum apertures configured to be coupled to a vacuum source to draw the support substrate toward the support surface.

23. The apparatus of claim 17, further comprising a pneumatic actuator operatively coupled to the dispense nozzle to propel the adhesive through the dispense nozzle.

24. An apparatus for dispensing a flowable adhesive on a support substrate for supporting microelectronic substrates, comprising:
    a source of the flowable adhesive;
    a support member;
    a first dispense nozzle carried by the support member and having a first aperture with a first flow area configured to dispense the adhesive toward the support substrate;
    a second dispense nozzle carried by the support member and having a second aperture with a second flow area configured to dispense the adhesive toward the support substrate, the second flow area being greater than the first flow area;
    a standoff member carried by the support member and having a contact surface projecting beyond the aperture of the dispense nozzle and configured to contact the support substrate while the aperture is spaced apart from the support substrate;
    a carrier having a support surface configured to releasably carry the support substrate; and
    an actuator operatively coupled to at least one of the dispense nozzle and the carrier to move at least one of the dispense nozzle and the carrier toward and away from the other.

25. An apparatus for dispensing a flowable adhesive on a support substrate for supporting microelectronic substrates, comprising:
    container means for containing a flowable adhesive;
    adhesive dispensing means coupleable to the container means and having an exit aperture configured to pass the flowable adhesive;
    contact means operatively coupled to the adhesive dispensing means and configured to contact the support substrate and at least restrict relative motion between the adhesive dispensing means and the support substrate while the exit aperture is spaced apart from the support substrate; and
    carrier means having a support surface configured to releasably carry the support substrate while the contact means contacts the support substrate, wherein the carrier means includes forcing means operatively coupled to the support surface to force the support surface toward a selected position.

26. The apparatus of claim 25 wherein the contact means is a first contact means and wherein the apparatus further comprises second contact means operatively coupled to the adhesive dispensing means, the second contact means being spaced apart from the first contact means to allow visual access to a region proximate to the exit aperture of the adhesive dispensing means.

27. The apparatus of claim 25 wherein the contact means has a contact surface projecting beyond the exit aperture of the adhesive dispensing means by a distance of from about 0.004 inch to about 0.005 inch.

28. The apparatus of claim 25 wherein the adhesive dispensing means is one of a plurality of adhesive dispensing means, each adhesive dispensing means being coupleable to the container means and having an exit aperture configured to pass the flowable adhesive.

29. The apparatus of claim 25 wherein the exit aperture of the adhesive dispensing means has a diameter of about 0.028 inch.

30. The apparatus of claim 25 wherein the support surface has a plurality of vacuum apertures configured to be coupled to a vacuum source to draw the support substrate toward the support surface.

31. The apparatus of claim 25, further comprising pressure means operatively coupled to the adhesive dispensing means to propel the adhesive through the nozzle.

32. The apparatus of claim 25, further comprising actuation means operatively coupled to the adhesive dispensing means to move the adhesive dispensing means along a path toward the support substrate.

33. The apparatus of claim 25 wherein the adhesive dispensing means is a first adhesive dispensing means and the exit aperture is a first exit aperture having a first flow area, and wherein the apparatus further comprises a second adhesive dispensing means having a second exit aperture with a second flow area greater than the first flow area.

34. A method for dispensing a flowable adhesive on a support substrate for supporting microelectronic substrates comprising:
    positioning a nozzle proximate to a support substrate;
    moving at least one of the nozzle and the support substrate toward the other;
    contacting a standoff member with the support substrate while the standoff member is operatively coupled to the nozzle and while an aperture of the nozzle is spaced apart from the support substrate to at least restrict further relative motion between the nozzle and the support substrate;
    directing a flowable adhesive through the aperture of the nozzle and toward the support substrate while the standoff member contacts the support substrate; and
    forcing the support substrate toward the standoff member while the standoff member contacts the support substrate.

35. The method of claim 34, further comprising attaching a microelectronic substrate to the support substrate by contacting the microelectronic substrate with the flowable adhesive on the support substrate.

36. The method of claim 34 wherein directing the flowable adhesive includes directing the flowable adhesive downwardly toward the microelectronic substrate.

37. The method of claim 34, further comprising attaching a microelectronic substrate to the support substrate by positioning the microelectronic substrate above the support substrate and moving at least one of the microelectronic substrate and the support substrate toward the other.

38. The method of claim 34, further comprising carrying the nozzle and the standoff member with a single support member.

39. The method of claim 34 wherein the nozzle is one of a plurality of nozzles, each having an aperture for passing the flowable adhesive and each being operatively coupled to the standoff member, and wherein the method further comprises providing a gap between the support substrate and the apertures of the nozzles by contacting the standoff member with the support substrate while the apertures are spaced apart from support substrate.

40. The method of claim 34 wherein the standoff member is a first standoff member and wherein the method further comprises contacting a second standoff member with the support substrate while the first and second standoff members are operatively coupled to the nozzle and while the aperture of the nozzle is spaced apart from the support substrate.

41. The method of claim 34, further comprising offsetting the aperture of the nozzle from the support substrate by a distance of from about 0.004 inch to about 0.005 inch while the standoff member contacts the support substrate.

42. The method of claim 34 wherein the dispense nozzle is one of a plurality of dispense nozzles, and wherein the method further comprises:
    positioning the plurality of nozzles proximate to the support substrate;
    contacting the standoff member with the support substrate while the standoff member is operatively coupled to the plurality of nozzles and while an aperture of each nozzle is spaced apart from the support substrate; and
    directing a flowable adhesive through the apertures of each nozzle and toward the support substrate while the standoff member contacts the support substrate.

43. The method of claim 34 wherein directing the flowable adhesive through an aperture includes directing the flowable adhesive through an aperture having a diameter of about 0.028 inch.

44. The method of claim 34, further comprising directing the flowable adhesive from a vessel into the nozzle.

45. The method of claim 34, further comprising supporting the support substrate on a surface of a carrier while the standoff member contacts the support substrate.

46. The method of claim 34, further comprising:
    carrying the support substrate with a carrier; and
    drawing the support substrate into contact with the carrier by applying a vacuum to the support substrate.

47. The method of claim 34, further comprising moving the nozzle toward the support substrate by activating a linear actuator operatively coupled to the nozzle.

48. The method of claim 34 wherein the dispense nozzle is a first dispense nozzle and the aperture is a first aperture having a first flow area, and wherein the method further comprises:
    positioning a second nozzle proximate to the support substrate;
    contacting the standoff member with the support substrate while the standoff member is operatively coupled to the second nozzle and while a second aperture of the second nozzle is spaced apart from the support substrate; and
    directing a flowable adhesive through the aperture of the second nozzle and toward the support substrate while the standoff member contacts the support substrate, the second aperture having a flow area greater than the first flow area.

49. The method of claim 34, further comprising visually accessing a region proximate to the aperture and the support substrate while the standoff member contacts the support substrate.

50. The method of claim 34, further comprising selecting the flowable adhesive to include an adhesive paste.

51. The method of claim 34, further comprising selecting the flowable adhesive to include a generally non-conductive epoxy.

52. A method for attaching a microelectronic substrate to a substrate support with an adhesive paste, comprising:
    carrying the substrate support with a carrier having a support surface;
    drawing the substrate support toward the support surface by applying a vacuum to the substrate support;
    moving a plurality of adhesive paste nozzles toward the support substrate;
    while a plurality of standoff members are operatively coupled to the nozzles and while an aperture of each nozzle is spaced apart from the support substrate, contacting the standoff members with the support substrate to restrict further motion of the nozzles toward the support substrate;
    forcing the support substrate into engagement with the plurality of standoff members to establish registration between the support substrate and the plurality of nozzles
    directing a flowable adhesive through the apertures of the nozzles and toward the support substrate while the standoff members contact the support substrate; and
    attaching a microelectronic substrate to the support substrate by contacting the microelectronic substrate with the flowable adhesive on the support substrate.

53. The method of claim 52 wherein directing the flowable adhesive includes directing the flowable adhesive downwardly toward the microelectronic substrate.

54. The method of claim 52 wherein attaching the microelectronic substrate includes positioning the microelectronic substrate above the support substrate and moving at least one of the microelectronic substrate and the support substrate toward the other.

55. The method of claim 52, further comprising offsetting the apertures of the nozzles from the support substrate by a distance of from about 0.004 inch to about 0.005 inch when the standoff member contacts the support substrate.

56. The method of claim 52 wherein directing the flowable adhesive through the apertures of the nozzles includes directing the flowable adhesive through at least one aperture having a diameter of about 0.028 inch.

57. The method of claim 52, further comprising visually accessing a region proximate to the aperture and the support substrate while the standoff member contacts the support substrate.

58. The method of claim 52, further comprising selecting the flowable adhesive to include a generally non-conductive epoxy.

59. A method for attaching a microelectronic substrate to a substrate support with an adhesive paste, comprising:
    carrying the substrate support with a carrier having a support surface;
    drawing the substrate support toward the support surface by applying a vacuum to the substrate support;
    moving a plurality of adhesive paste nozzles toward the support substrate;
    while a plurality of standoff members are operatively coupled to the nozzles and while an aperture of each nozzle is spaced apart from the support substrate, contacting the standoff members with the support substrate to restrict further motion of the nozzles toward the support substrate;

forcing at least one of the support substrate and the plurality of standoff members into engagement with the other to establish registration between the support substrate and the plurality of nozzles;

directing a flowable adhesive through the apertures of the nozzles and toward the support substrate while the standoff members contact the support substrate, wherein directing the flowable adhesive through the apertures of the nozzles includes directing a first portion of the adhesive through a first aperture having a first flow area and directing a second portion of the adhesive through a second aperture having a flow area greater than the first flow area; and attaching a microelectronic substrate to the support substrate by contacting the microelectronic substrate with the flowable adhesive on the support substrate.

* * * * *

UNITED STATES PATENT AND TRADEMARK OFFICE
CERTIFICATE OF CORRECTION

PATENT NO. : 6,564,979 B2  Page 1 of 1
DATED : May 20, 2003
INVENTOR(S) : Albert M. Savaria It is certified that error appears in the above-identified patent and that said Letters Patent is hereby corrected as shown below:

<u>Title page,</u>
Item [56], References Cited, U.S. PATENT DOCUMENTS,
"D394,944" should be -- D394,844 --

Signed and Sealed this

Twentieth Day of January, 2004

JON W. DUDAS
*Acting Director of the United States Patent and Trademark Office*